United States Patent
Reiss et al.

(10) Patent No.: US 9,425,037 B2
(45) Date of Patent: Aug. 23, 2016

(54) SILICON POLISHING COMPOSITIONS WITH IMPROVED PSD PERFORMANCE

(75) Inventors: Brian Reiss, Woodridge, IL (US); John Clark, Pflugerville, TX (US); Lamon Jones, Aurora, IL (US); Michael White, Ridgefield, CT (US)

(73) Assignee: Cabot Microelectronics Corporation, Aurora, IL (US)

( * ) Notice: Subject to any disclaimer, the term of this patent is extended or adjusted under 35 U.S.C. 154(b) by 667 days.

(21) Appl. No.: 13/351,339

(22) Filed: Jan. 17, 2012

(65) Prior Publication Data

US 2012/0190199 A1  Jul. 26, 2012

Related U.S. Application Data

(60) Provisional application No. 61/434,864, filed on Jan. 21, 2011.

(51) Int. Cl.
  *H01L 21/02* (2006.01)
  *C09G 1/02* (2006.01)

(52) U.S. Cl.
  CPC ............ *H01L 21/02024* (2013.01); *C09G 1/02* (2013.01)

(58) Field of Classification Search
  None
  See application file for complete search history.

(56) References Cited

U.S. PATENT DOCUMENTS

| | | | |
|---|---|---|---|
| 2007/0181534 A1* | 8/2007 | Kamimura | 216/88 |
| 2007/0224101 A1 | 9/2007 | Ohta et al. | |
| 2008/0254628 A1* | 10/2008 | Boggs et al. | 438/693 |
| 2009/0156006 A1* | 6/2009 | Anjur et al. | 438/693 |

FOREIGN PATENT DOCUMENTS

| | | |
|---|---|---|
| EP | 0967260 A1 | 12/1999 |
| EP | 1416025 A1 | 5/2004 |
| JP | 2010010454 A | 1/2010 |
| KR | 1020000006327 A | 1/2000 |
| KR | 1020050029726 A | 3/2005 |

OTHER PUBLICATIONS

Korean Intellectual Property Office, Notice of Preliminary Rejection issued in connection with Korean Patent Application No. 10-2013-7021843 on Mar. 16, 2016.
Japanese Intellectual Property Office, Notice of Reasons for Rejection issued in connection with Japanese Patent Application No. 2013-550530 on Feb. 23, 2016.

* cited by examiner

*Primary Examiner* — Duy Deo
(74) *Attorney, Agent, or Firm* — Thomas Omholt; Arlene Hornilla; Derek W. Barnett

(57) ABSTRACT

The invention relates to a chemical-mechanical polishing composition comprising silica, one or more tetraalkylammonium salts, one or more bicarbonate salts, one or more alkali metal hydroxides, one or more aminophosphonic acids, one or more rate accelerator compounds, one or more polysaccharides, and water. The polishing composition reduces surface roughness and PSD of polished substrates. The invention further relates to a method of chemically-mechanically polishing a substrate, especially a silicon substrate, using the polishing composition described herein.

5 Claims, No Drawings

SILICON POLISHING COMPOSITIONS WITH IMPROVED PSD PERFORMANCE

CROSS-REFERENCE TO RELATED PATENT APPLICATIONS

This patent application claims the benefit of U.S. Provisional Patent Application No. 61/434,864, filed Jan. 21, 2011.

BACKGROUND OF THE INVENTION

Silicon wafers used in electronic devices are typically prepared from a single crystal silicon ingot that is first sliced into thin wafers using a diamond saw, lapped to improve flatness, and etched to remove subsurface damage caused by lapping. The silicon wafers are then typically polished in a two-step process to remove nanotopography caused by etching and to achieve the desired thickness before the wafers are acceptable for use in electronic devices.

In the first polishing step, a high removal rate is required, and ideally the nanotopography is not degraded during this step. Nanotopography is a parameter that measures the front-surface topology of an area and is defined as the deviation of a surface within a spatial wavelength of about 0.2 mm to 20 mm. Nanotopography differs from surface flatness in that, for nanotopography, the flatness of the wafer surface is measured relative to the wafer surface itself, while for surface flatness, the flatness of the wafer surface is measured relative to a flat chuck used to hold the wafer. Thus, a wafer may have perfect flatness, yet still have nanotopography. If a wafer has surface irregularities on the front and back sides of the wafer, but the front and back surfaces are parallel, the wafer has perfect flatness. However, the same wafer will exhibit nanotopography. Nanotopography bridges the gap between roughness and flatness in the topology map of wafer surface irregularities in spatial frequency.

The roughness of a surface can be specified using several parameters, which consider roughness in terms of deviations from the horizontal plane of the mean surface level. For example, one parameter for measuring roughness is RMS roughness, which is the root mean squared value of all vertical deviations from the mean surface level. Another parameter for measuring roughness is surface roughness or average roughness ($R_a$), which is the arithmetical mean of deviations from planarity from the mean surface level. The distribution of roughness versus spatial frequency of features is defined by the Power Spectral Density (PSD) function or Power Spectrum. The PSD provides surface roughness data by computing the spatial power spectrum from an image of the surface.

The polishing process for silicon wafers results in a degree of roughness, even if only at the atomic level. Correct function of the fabricated component often is critically dependent on its degree of roughness. For example, computer hard disks have a narrow tolerance band for acceptable roughness. If the surface is too smooth, the read/write head may bind to the surface of the disk. If the surface is too rough, the head may be unable to fly over the disk surface on its air cushion in the proper manner. Moreover, surface roughness can affect a component's chemical and physical stability. Surfaces that have to stand up to hostile environments (e.g., temperature, humidity, or chemicals) must be as smooth as possible in order to present the minimum surface area for attack, and to have as few defects or weak spots as possible.

Conventional polishing compositions for silicon wafers exhibit high removal rates for silicon, but produce increased nanotopography and roughness of the silicon wafers. The increased nanotopography puts increased demands on the second, final polishing step to produce silicon wafers suitable for further processing into semiconductor substrates.

Thus, there remains an important need in the art for improved polishing compositions for silicon wafers.

BRIEF SUMMARY OF THE INVENTION

The invention provides a chemical-mechanical polishing composition comprising (a) silica, (b) one or more tetraalkylammonium salts, (c) one or more bicarbonate salts, one or more alkali metal hydroxides, (d) one or more aminophosphonic acids, (e) one or more rate accelerator compounds, (g) one or more polysaccharides, and (f) water.

The invention also provides a method of chemically-mechanically polishing a substrate comprising (i) contacting a substrate with a polishing pad and a chemical-mechanical polishing composition comprising (a) silica, (b) one or more tetraalkylammonium salts, (c) one or more bicarbonate salts, (d) one or more alkali metal hydroxides, (e) one or more aminophosphonic acids, (f) one or more rate accelerator compounds, (g) one or more polysaccharides, and (f) water; (ii) moving the polishing pad relative to the substrate with chemical-mechanical polishing composition therebetween; and (iii) abrading at least a portion of the substrate to polish the substrate.

DETAILED DESCRIPTION OF THE INVENTION

The invention provides a chemical-mechanical polishing composition and a method of chemically-mechanically polishing a substrate.

In an embodiment, the polishing composition comprises, consists essentially of, or consists of (a) silica, (b) one or more tetraalkylammonium salts, (c) one or more bicarbonate salts, (d) one or more alkali metal hydroxides, (e) one or more aminophosphonic acids, (f) one or more rate accelerator compounds selected from the group consisting of heterocyclic amines, mono amino acids, and hydroxy acids, (g) one or more polysaccharides selected from the group consisting of hydroxyalkylcelluloses, dextrans, carboxylated dextrans, and sulfonated dextrans, wherein at least one polysaccharide has an average molecular weight less than 300,000 g/mol, and (f) water.

The chemical-mechanical polishing composition of the invention surprisingly can be used to polish a substrate, especially a silicon substrate, such that the polished substrate exhibits a lower surface roughness as compared to the same substrate polished with a conventional polishing composition. Moreover, the inventive polishing compositions further exhibit a satisfactory removal rate during polishing.

The silica can be of any suitable form such as wet-process type silica, fumed silica, or combinations thereof. For example, the silica can comprise wet-process type silica particles (e.g., condensation-polymerized or precipitated silica particles). Condensation-polymerized silica particles typically are prepared by condensing $Si(OH)_4$ to form colloidal particles, where colloidal particles are defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil 50/80 product, the NALCO DVSTS006 product, and the Fuso PL-1, PL-1H, PL-1SL, PL-2, PL-2L, PL-3, PL-3H, PL-3L, PL-5, PL-6L, PL-7, PL-7H, PL-10H, and PL-20 products, as well as other similar products available from DuPont, Bayer, Applied Research, Silbond, Nissan Chemical, Clariant, and others.

The silica can comprise fumed silica particles. Fumed silica particles can be produced from volatile precursors (e.g., silicon halides) in a pyrogenic process by hydrolysis and/or oxidation of the precursors in a high temperature flame ($H_2$/air or $H_2$/$CH_4$/air). The solution containing the precursor can be sprayed into a high temperature flame using a droplet generator, and the metal oxide particles can then be collected. Typical droplet generators include bi-fluid atomizers, high-pressure spray nozzles, and ultrasonic atomizers. Suitable fumed silica products are commercially available from producers such as Cabot, Tokuyama, and Evonik Degussa.

The silica can have any suitable average particle size (i.e., average particle diameter). The silica can have an average particle size of about 10 nm or more, e.g., about 15 nm or more, about 20 nm or more, or about 25 nm or more. Alternatively, or in addition, the silica can have an average particle size of about 120 nm or less, e.g., about 110 nm or less, about 100 nm or less, about 90 nm or less, about 80 nm or less, about 70 nm or less, about 60 nm or less, 50 nm or less, or about 40 nm or less. Thus, the silica can have an average particle size bounded by any two of the above endpoints. For example, the silica can have an average particle size of about 10 nm to about 120 nm, about 15 nm to about 110 nm, about 20 nm to about 100 nm, about 25 nm to about 90 nm, or about 25 nm to about 80 nm. For a non-spherical silica particle, the size of the particle is the diameter of the smallest sphere that encompasses the particle. The particle size of the silica can be measured using any suitable technique, for example, using laser diffraction techniques. Suitable particle size measurement instruments are commercially available, such as from Malvern Instruments (Malvern, UK).

The silica particles desirably are suspended in the polishing composition, more specifically in the water of the polishing composition. When the silica particles are suspended in the polishing composition, the silica particles preferably are colloidally stable. The term colloid refers to the suspension of silica particles in the liquid carrier. Colloidal stability refers to the maintenance of that suspension over time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/ml) divided by the initial concentration of particles in the abrasive composition ([C] in terms of g/mL) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The polishing composition can comprise any suitable amount of silica. The polishing composition can comprise about 0.001 wt. % or more of silica, e.g., about 0.01 wt. % or more, about 0.05 wt. % or more, about 0.1 wt. % or more, about 0.2 wt. % or more, about 0.3 wt. % or more, about 0.4 wt. % or more, about 0.5 wt. % or more, or about 1 wt. % or more of silica. Alternatively, or in addition, the polishing composition can comprise about 20 wt. % or less of silica, e.g., about 15 wt. % or less, about 10 wt. % or less, about 8 wt. % or less, about 6 wt. % or less, about 5 wt. % or less, or about 2 wt. % or less of silica. Thus, the polishing composition can comprise silica in an amount bounded by any two of the above endpoints recited for silica. For example the polishing composition can comprise about 0.001 wt. % to about 20 wt. % of silica, or about 0.001 wt. % to about 15 wt. %, about 0.001 wt. % to about 10 wt. %, about 0.001 wt. % to about 8 wt. %, about 0.001 wt. % to about 6 wt. %, about 0.001 wt. % to about 5 wt. % of silica, about 0.001 wt. % to about 2 wt. %, or about 0.05 wt. % to about 2 wt. % of silica. In a preferred embodiment, the polishing composition comprises between about 0.2 wt. % and about 0.6 wt. % of silica. In another preferred embodiment, the polishing composition comprises between about 4 wt. % and about 5 wt. % of silica. In yet another preferred embodiment, the polishing composition comprises about 8 wt. % to about 12 wt. % of silica.

The polishing composition comprises one or more tetraalkylammonium salts. Not wishing to be bound by a particular theory, it is believed that the tetraalkylammonium salts stabilize the silica particles at high pH and ionic strength. Further, varying the chain length of the alkyl groups on the amines impacts surface roughness. The tetraalkylammonium salt preferably comprises a cation selected from the group consisting of tetramethylammonium, tetraethylammonium, tetrapropylammonium, and tetrabutylammonium. The tetraalkylammonium salt can have any suitable anion including but not limited to hydroxide, chloride, bromide, sulfate, or hydrogensulfate. In an embodiment, the tetraalkylammonium salt is a tetraalkylammonium hydroxide (e.g., tetramethylammonium hydroxide, tetraethylammonium hydroxide, or tetrapropylammonium hydroxide). In a preferred embodiment, the tetraalkylammonium salt is tetramethylammonium hydroxide. In another preferred embodiment, the tetraalkylammonium salt is tetrapropylammonium hydroxide. In yet another preferred embodiment, the tetraalkylammonium salt is a mixture of tetramethylammonium hydroxide and tetrapropylammonium hydroxide.

The polishing composition typically comprises about 0.1 wt. % or more, e.g., about 0.2 wt. % or more, about 0.3 wt. % or more, about 0.4 wt. % or more, about 0.5 wt. % or more, about 1 wt. % or more, or about 2 wt. % or more of one or more tetraalkylammonium salts. Alternatively, or in addition, the polishing composition can contain about 5 wt. % or less, e.g., about 4 wt. % or less, about 3 wt. % or less, about 2 wt. % or less, or about 1 wt. % or less of the tetraalkylammonium salts. Thus, the polishing composition can comprise the tetraalkylammonium salts in an amount bounded by any two of the above endpoints recited for the tetraalkylammonium salts. For example the polishing composition can comprise about 0.1 wt. % to about 5 wt. %, 0.2 wt. % to about 4 wt. %, or about 0.3 wt. % to about 3 wt. % of the tetraalkylammonium salts. In a preferred embodiment, the polishing composition comprises about 2 wt. % to about 3 wt. % of a tetraalkylammonium salt.

The polishing composition comprises one or more bicarbonate salts. Not wishing to be bound by a particular theory, it is believed that the bicarbonate salt functions to adjust the ionic strength of the polishing composition. The bicarbonate salt can be any suitable bicarbonate salt and can be, for example, potassium bicarbonate, sodium bicarbonate, ammonium bicarbonate, or combinations thereof.

The polishing composition typically comprises about 0.05 wt. % or more, e.g., about 0.1 wt. % or more, about 0.25 wt. % or more, or about 0.5 wt. % or more of the bicarbonate salts. Alternatively, or in addition, the polishing composition can contain about 5 wt. % or less, e.g., about 4 wt. % or less, about 3 wt. % or less, about 2 wt. % or less, or about 1 wt. % or less of the bicarbonate salts. Thus, the polishing composition can comprise the bicarbonate salts in an amount bounded by any two of the above endpoints recited for the bicarbonate salts. For example the polishing composition can comprise about 0.05 wt. % to about 5 wt. %, 0.1 wt. % to about 4 wt. %, about 0.25 wt. % to about 3 wt. %, or about 0.5 wt. % to about 2 wt. % of the bicarbonate salts.

The polishing composition comprises one or more alkali metal hydroxides. The alkali metal hydroxides act as a base to adjust the pH of the polishing composition. Suitable alkali metals include, for example, any of the Group I alkali earth metals, including but not limited to potassium hydroxide and sodium hydroxide.

The polishing composition typically comprises about 0.1 wt. % or more, e.g., about 0.1 wt. % or more, about 0.2 wt. % or more, or about 0.5 wt. % or more of the alkali metal hydroxide. Alternatively, or in addition, the polishing composition can contain about 1 wt. % or less, e.g., about 0.9 wt. % or less, about 0.8 wt. % or less, about 0.7 wt. % or less, or about 0.6 wt. % or less of the alkali metal hydroxide. Thus, the polishing composition can comprise the alkali metal hydroxide in an amount bounded by any two of the above endpoints recited for the alkali metal hydroxide. For example, the polishing composition can comprise about 0.1 wt. % to about 1 wt. %, 0.2 wt. % to about 0.9 wt. %, or about 0.3 wt. % to about 0.7 wt. % (e.g., about 0.4 wt. %, about 0.5 wt. %, or about 0.6 wt. %) of the alkali metal hydroxide.

The polishing composition can have any suitable pH, desirably, the polishing composition has an alkaline pH, that is, a pH greater than 7. For example, the polishing composition can have a pH of about 7.5 or higher, about 8.0 or higher, about 8.5 or higher, about 9.0 or higher, about 9.5 or higher, or about 10.0 or higher. Alternatively, or in addition, the polishing composition can have a pH of less than about 14, for example, about 13.5 or lower, about 13.0 or lower, about 12.5 or lower, about 12.0 or lower, about 11.5 or lower. Thus, the polishing composition can have a pH bounded by any two of the above endpoints. For example, the polishing composition can have a pH greater than 7 to less than about 14, more particularly, about 7.5 to about 13.5. In an embodiment, the polishing composition has a pH of about 10.5. In another embodiment, the polishing composition has a pH of about 9.5 to about 11. In yet another embodiment, the polishing composition, as a concentrate, has a pH of about 11 to about 13.

The polishing composition comprises one or more aminophosphonic acids. Not wishing to be bound by a particular theory, the aminophosphonic acid acts as a metal chelator in the polishing composition. Preferably, the aminophosphonic acid is selected from the group consisting of ethylenediaminetetra(methylene phosphonic acid), amino tri(methylene phosphonic acid), diethylenetriaminepenta(methylene phosphonic acid), salts thereof, and combinations thereof. More preferably, the aminophosphonic acid is amino tri(methylene phosphonic acid). An illustrative aminophosphonic acid is DEQUEST™ 2000 EG available commercially from ThermPhos International.

The polishing composition typically comprises about 0.02 wt. % or more, e.g., about 0.1 wt. % or more, about 0.2 wt. % or more, or about 0.5 wt. % or more of one or more aminophosphonic acids. Alternatively, or in addition, the polishing composition can contain about 2 wt. % or less, e.g., about 1.5 wt. % or less, or about 1 wt. % or less of the aminophosphonic acids. Thus, the polishing composition can comprise the aminophosphonic acids) in an amount bounded by any two of the above endpoints recited for the aminophosphonic acids. For example, the polishing composition can comprise about 0.02 wt. % to about 2 wt. %, 0.1 wt. % to about 1.5 wt. %, or about 0.5 wt. % to about 1 wt. % of the aminophosphonic acids.

The polishing composition comprises one or more rate accelerator compounds, i.e., a compound that increases the substrate removal rate. The one or more rate accelerator compounds are selected from the group consisting of heterocyclic amines, mono amino acids, and hydroxy acids. The polishing composition comprises a suitable amount of the rate accelerator compounds such that a beneficial effect on removal rate is observed.

In some embodiments, the rate accelerator compound is a heterocyclic amine. When the rate accelerator is a heterocyclic amine, typically the heterocyclic amine is selected from the group consisting of heterocyclic aromatic amines and heterocyclic aliphatic amines.

In a preferred embodiment, the heterocyclic aromatic amine is 1,2,4-triazole. In another preferred embodiment, the heterocyclic aliphatic amine is aminoethylpiperazine.

In some embodiments, the rate accelerator is a mono amino acid. A suitable mono amino acid is glycine.

In some embodiments, the rate accelerator is a hydroxy acid. A suitable hydroxy acid is lactic acid.

In some embodiments, the polishing composition can comprise more than one rate accelerator selected from the group consisting of heterocyclic amines, mono amino acids, and hydroxy acids.

The polishing composition comprises any suitable amount of the rate accelerator compounds. The polishing composition typically comprises about 0.02 wt. % or more, e.g., about 0.1 wt. % or more, about 0.125 wt. % or more, about 0.2 wt. % or more, 0.25 wt. % or more, or about 0.5 wt. % or more of the rate accelerator compounds. Alternatively, or in addition, the polishing composition can contain about 2 wt. % or less, e.g., about 1.5 wt. % or less, about 1 wt. % or less, or about 0.375 wt. % or less of the rate accelerator compounds. Thus, the polishing composition can comprise the rate accelerator compounds in an amount bounded by any two of the above endpoints recited for the rate accelerator compounds. For example, the polishing composition can comprise about 0.02 wt. % to about 2 wt. %, 0.1 wt. % to about 1.5 wt. %, or about 0.5 wt. % to about 1 wt. % of the rate accelerator compounds. In a preferred embodiment, the polishing composition comprises about 0.125 wt. % to about 0.375 wt. % of the rate accelerator compounds, e.g., about 0.25 wt. % of the rate accelerator compounds.

The polishing composition comprises one or more polysaccharides. Not wishing to be bound by a particular theory, it is believed that the polysaccharide reduces the $R_a$ and PSD of a substrate polished with the polishing composition. The polysaccharide is desirably water-soluble. The polysaccharide is selected from the group consisting of hydroxyalkylcelluloses, chitosan, dextrans, carboxylated dextrans, and sulfonated dextrans.

The polysaccharide has an average molecular weight less than 300,000 g/mol. In a preferred embodiment, the polishing composition comprises a polysaccharide having an average molecular weight of less than about 200,000 g/mol, more preferably an average molecular weight of about 20,000 g/mol to about 100,000 g/mol, and most preferably about 20,000 g/mol to about 80,000 g/mol.

In some embodiments, the polysaccharide is a hydroxyalkylcellulose. In a preferred embodiment, the polysaccharide is hydroxyethylcellulose (HEC).

In some embodiments; the polysaccharide is a chitosan.

In some embodiments, the polysaccharide is a dextran. Suitable dextrans include, for example, carboxylated dextrans and sulfonated dextrans.

The polishing composition comprises any suitable amount of the polysaccharides. The polishing composition typically comprises about 0.0001 wt. % or more, for example, about 0.0002 wt. % or more, 0.00025 wt. % or more, about 0.0003 wt. % or more, about 0.0004 wt. % or more, or about 0.0005 wt. % or more of the polysaccharides. Alternatively, or in addition, the polishing composition can comprise about 0.1 wt % or less, for example, about 0.09 wt. % or less, about 0.08 wt. % or less, about 0.07 wt. % or less, about 0.06 wt. % or less, or about 0.05 wt. % or less of the polysaccharides. Thus, the polishing composition can comprise the polysaccharides in an amount bounded by any two of the above endpoints recited for the polysaccharides. For example, the polishing composition can comprise about 0.0001 wt. % to about 0.1 wt. %, 0.0002 wt. % to about 0.09 wt. %, or about 0.0003 wt. % to about 0.07 wt. %, of the polysaccharides. In a preferred embodiment, the polishing composition comprises, as a concentrate, up to about 0.05 wt. % (e.g., about 0.00025 wt. % to about 0.05 wt. %) of one or more polysaccharides. In another preferred embodiment, the polishing composition comprises about 0.01 wt. % to about 0.05 wt. % of one or more polysaccharides. In yet another preferred embodiment, the polishing composition comprises about 0.0007 wt. % to about 0.003 wt. % of one or more polysaccharides.

The polishing composition comprises water. The water is used to facilitate the application of the other components of the polishing composition to the surface of a suitable substrate to be polished or planarized. Preferably, the water is deionized water.

The polishing composition can also comprise one or more biocides. The biocide can be any suitable biocide, for example an isothiazolinone biocide. The amount of biocide used in the polishing composition typically is about 1 to about 50 ppm, preferably about 10 to about 20 ppm.

The polishing composition can also comprise one or more surfactants (e.g., antifoaming agents). A typical disadvantage to the presence of surfactants is often a reduction of the overall removal rate for the silicon surface. The absorption of surfactants onto the silicon surface acts to reduce the contact of the abrasive particles with the silicon at the surface, and since contact of the abrasive particles with the metal surface is the primary mechanism by which the silicon surface is abraded, the removal rate is reduced, often below useful rates, thereby limiting the usefulness of surfactants in polishing compositions. However, a polishing composition comprising one or more surfactants advantageously improves the PSD performance.

The polishing composition can comprise any suitable amount of surfactant, when present. If the amount of surfactants is too low, then no advantage is observed with the addition of the surfactant. If the amount of surfactants is too high, then a reduction in the removal rate is observed. The amount of the surfactants can be about 0.1 ppm or more, about 0.5 ppm or more, about 1 ppm or more, about 5 ppm or more, about 10 ppm or more, about 20 ppm or more, about 50 ppm or more, about 100 ppm or more, or about 200 ppm or more. Alternatively, or in addition, the amount of the surfactants can be about 1000 ppm or less, about 800 ppm or less, about 600 ppm or less, about 400 ppm or less, or about 200 ppm or less. Thus, the polishing composition can comprise one or more surfactants in a total amount bounded by any two of the aforementioned endpoints recited for the surfactants. For example, the polishing composition can comprise about 10 ppm to about 1000 ppm, about 20 ppm to about 800 ppm, about 50 ppm to about 400 ppm, or about 100 ppm to about 200 ppm of the surfactants. In a preferred embodiment, the amount of the surfactants in the polishing composition is about 5 ppm. In another preferred embodiment, the amount of the surfactants in the polishing composition is about 150 ppm. In addition, surfactants can be incorporated with any useful co-solvent.

A surfactant, when present, can be any suitable surfactant. In an embodiment, the surfactant is a nonionic surfactant. Illustrative nonionic surfactants include acetylenic diol surfactants, for example, the SURFYNOL™ products commercially available from Air Products. An example of a SURFYNOL™ surfactant is SURFYNOL™ 104 (i.e., 1,4-diisobutyl-1,4-dimethylbutynediol), which is a nonionic wetting agent and molecular defoamer available as a waxy solid, a liquid, or a free-flowing powder.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., silica, tetraalkylammonium salt, bicarbonate salt, alkali metal hydroxide, aminophosphonic acid, rate accelerator compound, polysaccharide, etc.) as well as any combination of two or more of the ingredients (e.g., silica, tetraalkylammonium salt, bicarbonate salt, alkali metal hydroxide, aminophosphonic acid, rate accelerator compound, polysacCharide, etc.).

It will be understood that any of the components of the polishing composition that are salts (e.g., tetraalkylammonium salt, bicarbonate salt, alkali metal hydroxide, aminophosphonic acid, rate accelerator compound, etc.), when dissolved in the water of the polishing composition, can exist in dissociated form as cations and anions. The amounts of salts present in the polishing composition as recited herein will be understood to refer to the weight of the undissociated salt used in the preparation of the polishing composition. For example, the weight of an alkali metal hydroxide (e.g., potassium hydroxide), refers to the amount of the potassium salt as provided by its empirical formula (e.g., KOH).

For example, the tetraalkylammonium salt, bicarbonate salt, alkali metal hydroxide, aminophosphonic acid, and rate accelerator compound can be dissolved in water by the addition of the tetraalkylammonium salt, bicarbonate salt, alkali metal hydroxide, aminophosphonic acid, and rate accelerator compound to water in any order, or even simultaneously. The silica then can be added and dispersed by any method that is capable of dispersing the silica in the polishing composition. The polishing composition can be prepared prior to use, with one or more components, such as the base, added to the polishing composition shortly before use (e.g., within about 1 minute before use, or within about 1 hour before use, or within about 7 days before use). The pH can be adjusted at any suitable time, and is preferably adjusted prior to the addition of the silica to the polishing composition. The polishing composition also can be prepared by mixing the components at the surface of the substrate during the polishing operation.

The polishing composition can be in the form of a concentrate which is intended to be diluted with an appropriate amount of water prior to use. For example, each individual ingredient of the polishing composition except for water can be present in the concentrate in an amount that is about 2 times (e.g., about 5 times, about 10 times, or about 15 times, or about 20 times, or about 100 times, or even about 200 times) greater than the concentration recited above for each individual ingredient so that, when the concentrate is diluted with an equal volume of water (e.g., 2 equal volumes water, 5 equal volumes of water, or 10 equal volumes of water, or 15 equal volumes of water, or 20 equal volumes of water, or 100 equal volumes of water, or 200 equal volumes of water, respectively), each individual ingredient will be present in the polishing composition in an amount within the ranges set forth above for each individual ingredient. Furthermore, as will be understood by those of ordinary skill in the art, the concentrate can contain an appropriate fraction of the water present in the final polishing composition in order to ensure that the individual ingredients are at least partially or fully dissolved in the concentrate, preferably fully dissolved in the concentrate.

In another embodiment, the invention provides a method of chemically-mechanically polishing a substrate comprising (i) contacting a substrate with a polishing pad and a chemical-mechanical polishing composition as described herein, (ii) moving the polishing pad relative to the substrate with chemical-mechanical polishing composition therebetween, and (iii) abrading at least a portion of the substrate to polish the substrate.

Although the polishing composition of the invention can be used to polish any substrate, the polishing composition is particularly useful in the polishing of a substrate comprising silicon, for example, silicon wafers used in the electronics industry. In this regard, the silicon can be undoped silicon, or it can be p-type silicon doped with boron or aluminum. In addition, the silicon can be polysilicon. The inventive polishing composition and method of use thereof are suitable for the final polishing of silicon wafers as produced from silicon single crystals by diamond sawing and rough grinding, as well as for edge polishing of silicon wafers and for use in the reclamation of silicon wafers by polishing.

Advantageously, silicon substrates polished using the inventive polishing method exhibit low surface roughness. Surface roughness ($R_a$), which is defined herein as the arithmetical mean of deviations from planarity, can be measured using any suitable technique. Suitable techniques include stylus profilometry and optical profilometry, using instruments available from, for example, Veeco Instruments (Plainview, N.Y.), as well as atomic force microscopy. Typically, the inventive polishing method produces a surface roughness on silicon wafers of about 20 Å or less (e.g., about 14 Å or less, about 12 Å or less, about 10 Å or less, or even about 8 Å or less), when measured using an optical profilometer.

In addition, metrology has been developed to measure PSD of polished substrates using an optical interferometer available from, for example, Veeco Instruments. Surprisingly, the polishing composition of the invention can reduce PSD of the substrate polished therewith as compared to conventional polishing compositions. For example, in some embodiments, a silicon wafer polished using a polishing composition of the invention has a PSD value of less than about 3 nm, e.g., less than about 2.5 nm, or about 2.0 nm to about 2.5 nm.

In keeping with another aspect of the invention, when the polishing composition comprises HEC as a polysaccharide, the PSD value can be reduced by as much as 30% as compared to conventional polishing compositions by varying the HEC/solids ratio while maintaining a satisfactory removal rate during polishing.

Moreover, PSD performance has been found to be inversely proportional to removal rate during polishing (i.e., polishing compositions exhibiting an improved PSD performance typically exhibit lower removal rates). However, a polishing composition comprising a suitable amount of rate accelerator, as described herein, exhibits a satisfactory removal rate.

The polishing method of the invention is particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures, thereof. Hard polyurethane polishing pads are particularly useful in conjunction with the inventive polishing method.

An illustrative polishing pad is the SUBA™ polishing pads commercially available from Rohm and Haas. For example, the SUBA™ 500 is a polyurethane impregnated polyester felt that is designed for stock and intermediate polishing where achieving a high precision surface is important.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

The following examples further illustrate the invention but, of course, should not be construed as in any way limiting its scope.

EXAMPLES

The following conditions were used during polishing unless otherwise indicated. Silicon substrates were polished with the polishing compositions and a SUBA™ 500 polishing pad commercially available from Rohm and Haas. The flow rate of the polishing compositions onto the polishing pad was 100 mL/min. The polishing platen was operated at a speed of 100 rpm, and the polishing head was operated at a speed of 93 rpm. The silicon substrates contacted the polishing pad with a downforce of 24.1 kPa (3.5 psi).

The PSD of polished substrates was measured using a Veeco optical interferometer and the associated control software. Images (2×2 mm) from the interferometer were collected using a 5× objective and were used to measure. PSD. Filtering was not used to remove roughness of any frequency from the images.

Example 1

This example demonstrates that polishing compositions of the invention comprising silica, one or more tetraalkylammonium salts, one or more bicarbonate salts, one or more alkali metal hydroxides, one or more aminophosphonic acids, one or more rate accelerator compounds, one or more polysaccharides, and water, exhibit good polishing properties, including improved PSD performance.

Silicon substrates were polished using the conditions described above with two different polishing compositions identified as Polishing Compositions 1A and 1B. Polishing Compositions 1A and 1B were prepared as 15× concentrates, and each contained (a) 10 wt. % silica (Nalco DVSTS006 silica particles), (b) 2.0 wt. % tetramethylammonium hydroxide (TMAH), (c) 1.0 wt. % potassium bicarbonate (KHCO$_3$), (d) 0.61 wt. % potassium hydroxide (KOH), (e) 0.3 wt. % aminotri(methylene phosphonic acid) (i.e., DEQUEST™ 2000EG metal chelator), (f) 0.25 wt. % 1,2,4-triazole, and (g) either 0.025 wt. % hydroxyethylcellulose (HEC), or 0.025 wt. % dextran, as indicated in Table 1, and (h) water. Comparative Polishing Composition C1 was identical to Polishing Compositions 1A and 1B, except it did not contain a polysaccharide (i.e., either HEC or dextran).

The PSD was determined for each polishing composition, and the results are set forth in Table 1.

TABLE 1

| | Composition (wt. %) | | |
|---|---|---|---|
| Component | C1 | 1A | 1B |
| silica particles | 10 | 10 | 10 |
| TMAH | 2.0 | 2.0 | 2.0 |
| KHCO$_3$ | 1.0 | 1.0 | 1.0 |
| KOH | 0.61 | 0.61 | 0.61 |
| DEQUEST ™ 2000EG | 0.3 | 0.3 | 0.3 |
| 1,2,4-triazole | 0.25 | 0.25 | 0.25 |
| HEC | — | 0.025 | — |
| dextran | — | — | 0.025 |
| PSD$_{mean}$ (nm) | 2.67 | 2.47 | 2.52 |

As indicated by the results set forth in Table 1, polishing compositions comprising silica, one or more tetraalkylammonium salts, one or more bicarbonate salts, one or more alkali metal hydroxides, one or more aminophosphonic acids, one or more rate accelerator compounds, one or more polysaccharides, and water, exhibit good polishing properties, including an improved PSD performance. For example, polishing compositions containing HEC (Polishing Composition 1A) or dextran (Polishing Composition 1B) reduced the PSD of the polished substrate by as much as about 8.5% as compared to Polishing Composition C1, which did not contain a polysaccharide.

Example 2

This example demonstrates the effect of different tetraalkylammonium salts on PSD performance and removal rate.

Silicon substrates were polished with four different polishing compositions using the polishing conditions described above with polishing compositions identified as Polishing Compositions 2A-2D. Polishing Compositions 2A-2D were prepared as 20× concentrates, and each contained (a) 10 wt. % silica (i.e., Nalco DVSTS006 silica particles), (b) tetramethylammonium hydroxide (TMAH) and optionally tetrapropylammonium hydroxide (TPAH) in the amounts indicated in Table 2, (c) 1.0 wt. % potassium bicarbonate (KHCO$_3$), (d) 0.61 wt. % potassium hydroxide (KOH), (e) 0.3 wt. % aminotri(methylene phosphonic acid) (i.e., DEQUEST™ 2000EG metal chelator), (f) 0.25 wt. % 1,2,4-triazole (g) 0.025 wt. % hydroxyethylcellulose (HEC), and (g) the balance water. The molar concentration of tetraalkylammonium salts was kept constant in each polishing composition; however, Polishing Composition 2A contained only TMAH, while Polishing Compositions 2B-2D contained both TMAH and TPAH.

The PSD and removal rate was determined for each polishing composition, and the results are set forth in Table 2.

TABLE 2

| | Composition (wt. %) | | | |
|---|---|---|---|---|
| Component | 2A | 2B | 2C | 2D |
| silica particles | 10 | 10 | 10 | 10 |
| TMAH | 2.67 | 2.4 | 2.0 | 1.8 |
| TPAH | — | 0.6 | 1.49 | 1.98 |
| KHCO$_3$ | 1.0 | 1.0 | 1.0 | 1.0 |
| KOH | 0.61 | 0.61 | 0.61 | 0.61 |
| DEQUEST ™ 2000EG | 0.3 | 0.3 | 0.3 | 0.3 |
| 1,2,4-triazole | 0.25 | 0.25 | 0.25 | 0.25 |
| removal rate (Å/min) | 5944 | 5854 | 5703 | 5255 |
| PSD$_{mean}$ (nm) | 2.52 | 1.99 | 2.07 | 2.12 |

As indicated by the results set forth in Table 2, polishing compositions containing both TMAH and TPAH (Polishing Compositions 2B-2D) exhibited an improved PSD performance as compared to a polishing composition containing only TMAH (Polishing Composition 2A). For example, Polishing Composition 2B exhibited a 21% percent improvement in PSD performance as compared to Polishing Composition 2A, while maintaining a suitable removal rate.

Example 3

This example demonstrates the effect of different rate accelerator compounds on PSD performance and removal rate.

Silicon substrates were polished with four different polishing compositions using the polishing conditions described above with polishing compositions identified as Polishing Compositions 3A-3D. Polishing Compositions 3A-3D were prepared as 15× concentrates, and each contained (a) 10 wt. % silica (Nalco DVSTS006 silica particles), (b) 2.67 wt. % tetramethylammonium hydroxide (TMAH), (c) 1.0 wt. % potassium bicarbonate (KHCO$_3$), (d) 0.61 wt. % potassium hydroxide (KOH), (e) 0.3 wt. % aminotri(methylene phosphonic acid) (i.e., DEQUEST™ 2000EG metal chelator), (f) either 0.25 wt. % 1,2,4-triazole, 0.25 wt. % aminoethylpiperazine, 0.25 wt. % glycine, or 0.25 wt. % lactic acid, and (g) the balance water. Polishing Compositions 3B-3D contained either aminoethylpiperazine, glycine, or lactic acid, respectively, as equimolar replacements for the 1,2,4-triazole in Polishing Composition 3A.

The PSD and removal rate were determined for each polishing composition, and the results are set forth in Table 3.

TABLE 3

| | Composition (wt. %) | | | |
|---|---|---|---|---|
| Component | 3A | 3B | 3C | 3D |
| silica particles | 10 | 10 | 10 | 10 |
| TMAH | 2.67 | 2.67 | 2.67 | 2.67 |
| KHCO$_3$ | 1.0 | 1.0 | 1.0 | 1.0 |
| KOH | 0.61 | 0.61 | 0.61 | 0.61 |
| DEQUEST ™ 2000EG | 0.3 | 0.3 | 0.3 | 0.3 |
| 1,2,4-triazole | 0.25 | — | — | — |
| aminoethylpiperazine | — | 0.25 | — | — |
| glycine | — | — | 0.25 | — |
| lactic acid | — | — | — | 0.25 |
| removal rate (Å/min) | 5944 | 5385 | 5499 | 5466 |
| PSD$_{mean}$ (nm) | 2.52 | 2.30 | 2.36 | 2.39 |

As indicated by the results set forth in Table 3, the substitution of the rate accelerator compound can result in an improvement in the PSD performance, while maintaining a suitable removal rate. For example, Polishing Composition 3B, which contained aminoethylpiperazine, exhibited an improvement in PSD performance of greater than 8%, as compared to Polishing Composition 3A, which contained 1,2,4-triazole.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing composition comprising:
   (a) silica,
   (b) one or more tetraalkylammonium salts,
   (c) one or more bicarbonate salts,
   (d) one or more alkali metal hydroxides, (e) one or more aminophosphonic acids,
   (f) at least one rate accelerator compound is a heterocyclic aliphatic amine,
   (g) one or more polysaccharides selected from the group consisting of hydroxyalkylcelluloses, dextrans, carboxylated dextrans, and sulfonated dextrans, wherein a least one polysaccharide has an average molecular weight less than 300,000 g/mol, and
   (f) water.

2. The polishing composition of claim 1, wherein the heterocyclic aliphatic amine is aminoethylpiperazine.

3. A chemical-mechanical polishing composition comprising:
   (a) silica,
   (b) one or more tetraaikylammonium salts,
   (c) one or more bicarbonate salts,
   (d) one or more alkali metal hydroxides, (e) one or more aminophosphonic acids,
   (f) one or more rate accelerator compounds selected from the group consisting of heterocyclic amines, mono amino acids, and hydroxy acids,
   (g) at least one polysaccharides is a dextran, wherein at least one polysaccharide has an average molecular weight less than 300,000 g/mol, and
   (f) water.

4. A chemical-mechanical polishing composition comprising:
   (a) silica,
   (b) one or more tetraalkyiammonium salts,
   (c) one or more bicarbonate salts,
   (d) one or more alkali metal hydroxides, (e) one or more aminophosphonic acids,
   (f) one or more rate accelerator compounds selected from the group consisting of heterocyclic amines, mono amino acids, and hydroxy acids,
   (g) at least one polysaccharides is a carboxylated dextran, wherein at least one polysaccharide has an average molecular weight less than 300,000 g/mol, and
   (f) water.

5. A chemical-mechanical polishing composition comprising:
   (a) silica,
   (b) one or more tetraalkyiammonium salts,
   (c) one or more bicarbonate salts,
   (d) one or more alkali metal hydroxides, (e) one or more aminophosphonic acids,
   (f) one or more rate accelerator compounds selected from the group consisting of heterocyclic amines, mono amino acids, and hydroxy acids,
   (g) at least one polysaccharides is a sulfonated dextran, wherein at least one polysaccharide has an average molecular weight less than 300,000 g/mol, and
   (f) water.

* * * * *